(12) United States Patent
Watanabe et al.

(10) Patent No.: US 10,052,741 B2
(45) Date of Patent: Aug. 21, 2018

(54) SEMICONDUCTOR MANUFACTURING APPARATUS AND METHOD OF MANUFACTURING SEMICONDUCTOR DEVICE

(71) Applicant: TOSHIBA MEMORY CORPORATION, Minato-ku (JP)

(72) Inventors: Takashi Watanabe, Yokkaichi (JP); Shunsuke Doi, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 126 days.

(21) Appl. No.: 15/226,402

(22) Filed: Aug. 2, 2016

(65) Prior Publication Data

US 2017/0259399 A1 Sep. 14, 2017

(30) Foreign Application Priority Data

Mar. 8, 2016 (JP) .................................. 2016-044815

(51) Int. Cl.
*B24B 53/00* (2006.01)
*B24B 53/017* (2012.01)
*B24B 37/20* (2012.01)
*H01L 21/306* (2006.01)

(52) U.S. Cl.
CPC ............ *B24B 53/017* (2013.01); *B24B 37/20* (2013.01); *H01L 21/30625* (2013.01)

(58) Field of Classification Search
CPC .. B24B 53/017; B24B 37/20; H01L 21/30625
USPC ....................................... 451/5, 41, 285–290
See application file for complete search history.

(56) References Cited

U.S. PATENT DOCUMENTS

| 5,582,534 | A | 12/1996 | Shendon et al. | |
| 6,231,425 | B1 | 5/2001 | Inaba et al. | |
| 6,843,711 | B1 | 1/2005 | Muldowney | |
| 7,150,675 | B2 | 12/2006 | Kramer et al. | |
| 9,469,013 | B2* | 10/2016 | Tanikawa | B24B 49/006 |
| 2002/0037681 | A1* | 3/2002 | Gitis | B24B 37/013 451/5 |
| 2003/0049993 | A1* | 3/2003 | Fujii | B24B 37/013 451/8 |
| 2007/0123154 | A1* | 5/2007 | Nabeya | B24B 53/017 451/285 |

(Continued)

FOREIGN PATENT DOCUMENTS

| JP | 10-180613 | 7/1998 |
| JP | 11-48124 | 2/1999 |

(Continued)

*Primary Examiner* — George Nguyen
(74) *Attorney, Agent, or Firm* — Oblon, McClelland, Maier & Neustadt, L.L.P.

(57) ABSTRACT

In one embodiment, a semiconductor manufacturing apparatus includes a polishing table configured to hold a polishing pad for polishing a substrate, and to rotate the polishing pad. The apparatus further includes a dressing module configured to hold a dresser for dressing the polishing pad, and to dress a surface of the polishing pad by sweeping the polishing pad with the dresser while rotating the dresser. The apparatus further includes a controller configured to control a number of revolutions of the polishing table based on a position of the dresser to the polishing table, while the polishing pad is dressed.

10 Claims, 6 Drawing Sheets

(56) References Cited

U.S. PATENT DOCUMENTS

| | | | |
|---|---|---|---|
| 2008/0287043 A1* | 11/2008 | Saito | B24B 49/14 451/285 |
| 2009/0047869 A1* | 2/2009 | Kamiya | B24B 7/228 451/8 |
| 2009/0137190 A1* | 5/2009 | Togawa | B24B 37/013 451/8 |
| 2012/0252320 A1* | 10/2012 | Seki | B24B 21/002 451/28 |
| 2016/0184961 A1* | 6/2016 | Shinozaki | B24B 37/005 451/5 |

FOREIGN PATENT DOCUMENTS

| | | |
|---|---|---|
| JP | 2000-61812 | 2/2000 |
| JP | 4386897 | 12/2009 |
| JP | 4699371 | 6/2011 |
| JP | 4916657 | 4/2012 |

* cited by examiner

SEMICONDUCTOR MANUFACTURING APPARATUS AND METHOD OF MANUFACTURING SEMICONDUCTOR DEVICE

CROSS REFERENCE TO RELATED APPLICATION

This application is based upon and claims the benefit of priority from the prior Japanese Patent Application No. 2016-44815, filed on Mar. 8, 2016, the entire contents of which are incorporated herein by reference.

FIELD

Embodiments described herein relate to a semiconductor manufacturing apparatus and a method of manufacturing a semiconductor device.

BACKGROUND

In general, a chemical mechanical polishing (CMP) apparatus includes a dressing module that dresses (sets) a surface of a polishing pad on a polishing table with a dresser to prevent a decrease in polishing rate, an occurrence of scratch, and an occurrence of dust.

For example, a sweep-type dressing module dresses the surface of the polishing pad by sweeping the polishing pad with the dresser while rotating the dresser. At this time, the CMP apparatus rotates the polishing table at a constant number of revolutions. Therefore, when the dressing is performed by the sweep-type dressing module, a relative linear speed between the polishing table and the dresser changes between the dressing that is performed at the center of the polishing table and the dressing that is performed at the periphery of the polishing table. Specifically, the relative linear speed between the polishing table and the dresser becomes slow at the center of the polishing table, and becomes fast at the periphery of the polishing table.

If the polishing pad is dressed, a surface roughness of the polishing pad is increased, so that the polishing performance of the polishing pad is improved. However, when the dressing is performed by the sweep-type dressing module, the surface roughness of each portion of the polishing pad is changed according to the relative linear speed between the polishing table and the dresser. Therefore, in-plane variation of the surface roughness of the polishing pad occurs due to an difference in the relative linear speed between the center and the periphery of the polishing table. As a result, when a wafer is polished with this polishing pad, in-plane variation of the polishing rate of the wafer may occur, and a polishing temperature of the wafer may fluctuate so as to generate a corrosion.

DETAILED DESCRIPTION

Embodiments will now be explained with reference to the accompanying drawings.

In one embodiment, a semiconductor manufacturing apparatus includes a polishing table configured to hold a polishing pad for polishing a substrate, and to rotate the polishing pad. The apparatus further includes a dressing module configured to hold a dresser for dressing the polishing pad, and to dress a surface of the polishing pad by sweeping the polishing pad with the dresser while rotating the dresser. The apparatus further includes a controller configured to control a number of revolutions of the polishing table based on a position of the dresser to the polishing table, while the polishing pad is dressed.

First Embodiment

Figure 1:
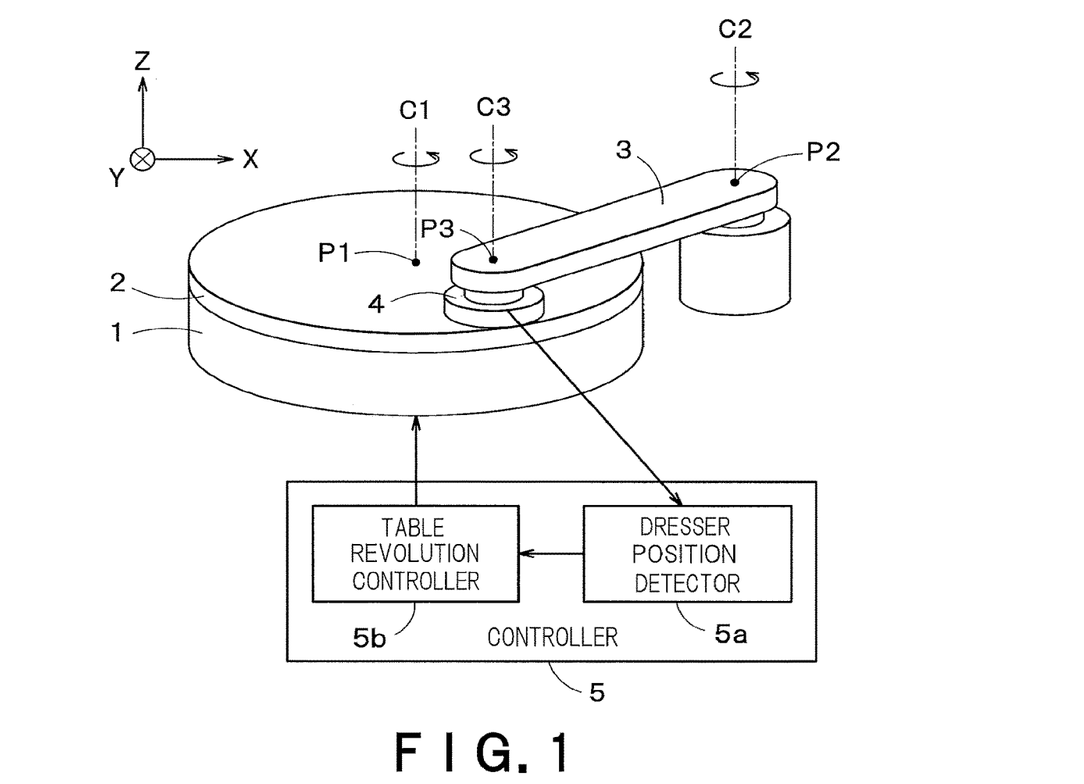
FIG. 1 is a perspective view illustrating a structure of a semiconductor manufacturing apparatus of a first embodiment.

FIG. 1 is a perspective view illustrating a structure of a semiconductor manufacturing apparatus of a first embodiment.

The semiconductor manufacturing apparatus in FIG. 1 includes a polishing table 1 configured to hold a polishing pad 2, a dressing module 3 configured to hold a dresser 4, and a controller 5 configured to control various operations of the semiconductor manufacturing apparatus. The semiconductor manufacturing apparatus in FIG. 1 is a CMP apparatus that polishes a wafer (not shown) as an example of a substrate by CMP.

FIG. 1 indicates an X direction, a Y direction and a Z direction that are perpendicular to each other. In the present embodiment, the X and Y directions are parallel to the installing plane of the semiconductor manufacturing apparatus, and the Z direction is perpendicular to the installing plane of the semiconductor manufacturing apparatus. In the present specification, the +Z direction is assumed to be an upper direction, and the −Z direction is assumed to be a lower direction. In FIG. 1, the polishing pad 2 is held upward, and the dresser 4 is held downward. The −Z direction of the present embodiment may or may not coincide with the gravity direction.

The polishing table 1 rotates the polishing pad 2 around the rotational axis C1. The rotational axis C1 of the present embodiment is parallel to the Z direction. A rotational center of the polishing table 1 and a rotational center P1 of the polishing pad 2 are positioned on the rotational axis C1. The polishing pad 2 of the present embodiment is attached on an upper face of the polishing table 1.

When the wafer is to be polished, the semiconductor manufacturing apparatus in FIG. 1 rotates the wafer by a polishing head (not shown), rotates the polishing pad 2 by the polishing table 1, and brings the wafer into contact with the polishing pad 2 to press the wafer onto the polishing pad 2 with a constant load. In this manner, a surface of the wafer is polished with the polishing pad 2.

The dressing module 3 includes an arm for holding the dresser 4. The dressing module 3 can sweep the polishing pad 2 with the dresser 4 by rotating the arm around the rotational axis C2. The dressing module 3 can also dress a surface of the polishing pad 2 with the dresser 4 by rotating the dresser 4 around the rotational axis C3 that is on the arm. The rotational axis C2 is parallel to the Z direction, and passes through a point P2 that is on one end of the arm. The rotational axis C3 is parallel to the Z direction, and passes through a point P3 that is on the other end of the arm. A rotational center of the arm is positioned on the rotational axis C2, and a rotational center of the dresser 4 is positioned on the rotational axis C3. Diamond grains are bonded on a lower face of the dresser 4 in the present embodiment.

When the polishing pad 2 is to be dressed with the dresser 4, the semiconductor manufacturing apparatus in FIG. 1 rotates the polishing pad 2 by the polishing table 1, rotates the dresser 4 by the dressing module 3, and brings the dresser 4 into contact with the polishing pad 2 to press the dresser 4 onto the polishing pad 2 with a constant load. At this time, the polishing pad 2 and the dresser 4 in the present embodiment are rotated in the same direction.

The semiconductor manufacturing apparatus in FIG. 1 can dress the polishing pad 2 by sweeping the polishing pad 2 with the dresser 4 while rotating the polishing pad 2 and the dresser 4. The present embodiment makes it possible, by sweeping the polishing pad 2 with the dresser 4, to dress a whole surface of the polishing pad 2 with the dresser 4 that is smaller than the polishing pad 2.

The controller 5 includes at least one processor, and controls operations of the semiconductor manufacturing apparatus by the processor. The processor is, for example, a micro processor unit (MPU). For example, the controller 5 controls a rotational operation of the polishing pad 2 by the polishing table 1, a sweep operation of the dresser 4 by the dressing module 3, and a rotational operation of the dresser 4 by the dressing module 3. The controller 5 of the present embodiment includes a dresser position detector 5a and a table revolution controller 5b.

The dresser position detector 5a detects a center position of the dresser 4. The center position of the dresser 4 is a position of the rotational center of the dresser 4, and corresponds to a position of the rotational axis C3 of the dresser 4. The dresser position detector 5a of the present embodiment may detect the center position of the dresser 4 by any method that can detect a distance between a center position of the polishing table 1 and the center position of the dresser 4. The center position of the polishing table 1 is a position of the rotational center of the polishing table 1, and corresponds to a position of the rotational axis C1 of the polishing table 1. In the present embodiment, the center position of the dresser 4 is moved by sweeping, whereas the center position of the polishing table 1 is fixed.

Examples of the method for detecting the center position of the dresser 4 are as below. For example, the dresser position detector 5a may detect the center position of the dresser 4 by measuring a rotation angle of the arm with respect to the rotational axis C2 (sweeping axis). Furthermore, the dresser position detector 5a may detect the center position of the dresser 4 by using an infrared sensor. Moreover, the dresser position detector 5a may detect the center position of the dresser 4 by calculating a rotation angle of the arm with respect to the rotational axis C2 (sweeping axis) from a sweeping speed of the dressing module 3.

The table revolution controller 5b obtains a detection result of the center position of the dresser 4 from the dresser position detector 5a. Furthermore, the table revolution controller 5b controls a number of revolutions of the polishing table 1 (polishing pad 2) based on the center position of the dresser 4, while the polishing pad 2 is dressed. This control will be described in detail later. The center position of the dresser 4 is an example of a position of the dresser 4 to the polishing table 1.

Figure 2:
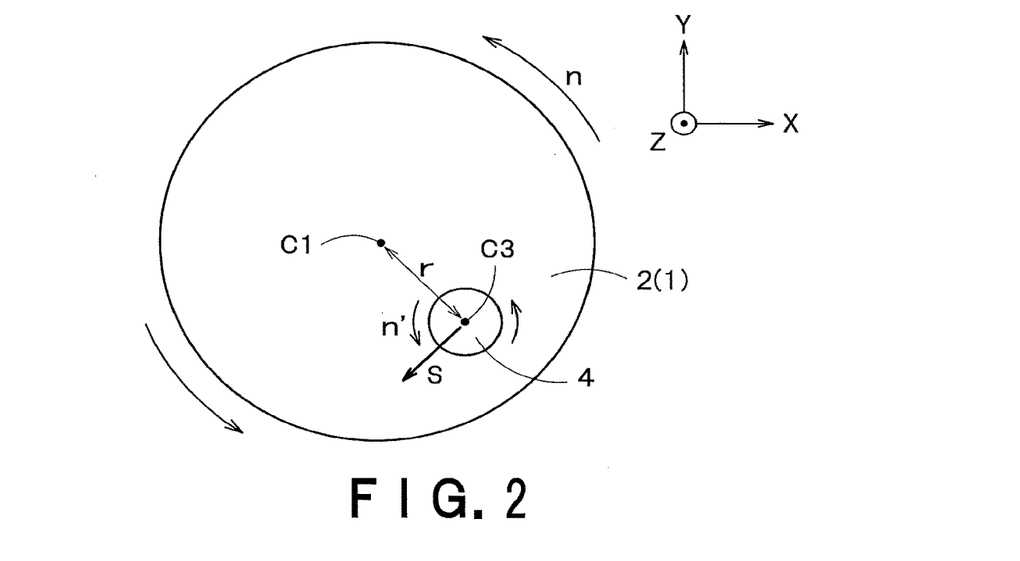
FIG. 2 is a top view illustrating the structure of the semiconductor manufacturing apparatus of the first embodiment.

FIG. 2 is a top view illustrating the structure of the semiconductor manufacturing apparatus of the first embodiment.

FIG. 2 indicates a distance "r" (m) between the center position of the polishing table 1 and the center position of the dresser 4, and a relative linear speed "S" (m/min) between the polishing table 1 and the dresser 4. The distance "r" corresponds to a distance between the rotational axis C1 and the rotational axis C3. The relative linear speed "S" corresponds to a linear speed of the center position of the dresser 4 with respect to the polishing table 1. Therefore, when motion of the dresser 4 is monitored on a coordinate system fixed to the polishing table 1, the center position of the dresser 4 moves on a surface of the polishing table 1 at the linear speed "S".

FIG. 2 further indicates a number of revolutions "n" (rpm) of the polishing table 1, and a number of revolutions "n'" (rpm) of the dresser 4. Hereinafter, the number of revolutions "n" is called a table revolution, and the number of revolutions "n'" is called a dresser revolution. The table revolution "n" is calculated by the following formula (1) by using the distance "r" and the relative linear speed "S".

$$n = S/(2\pi r) \qquad (1).$$

In the present embodiment, the dresser position detector 5a detects the distance "r" between the center position of the polishing table 1 and the center position of the dresser 4, and the table revolution controller 5b controls the table revolution "n" based on the distance "r". Specifically, the table revolution controller 5b controls the table revolution "n" such that the relative linear speed "S" is maintained constant even if the distance "r" is changed. The reason is that a surface roughness of each portion of the polishing pad 2 is changed according to the relative linear speed "S" between the polishing table 1 and the dresser 4. The present embodiment makes it possible, by maintaining the relative linear speed "S" constant, to reduce in-plane variation of the surface roughness of the polishing pad 2.

Therefore, the table revolution controller 5b of the present embodiment reduces the table revolution "n" with an increase in the distance "r". Specifically, the table revolution controller 5b changes the table revolution "n" so as to be inversely proportional to the distance "r". The reason is that when the table revolution "n" is inversely proportional to the distance "r", the relative linear speed "S" becomes constant due to the formula (1). Therefore, the table revolution "n" of the present embodiment becomes large when the dresser 4 is positioned at the center of the polishing table 1, and becomes small when the dresser 4 is positioned at the periphery of the polishing table 1. As a result, the relative linear speed "S" of the present embodiment becomes the same value both at the center and the periphery of the polishing table 1.

In this manner, when the distance "r" between the center position of the polishing table 1 and the center position of the dresser 4 is changed, the controller 5 of the present embodiment changes the table revolution "n". On the other hand, even if the distance "r" between the center position of the polishing table 1 and the center position of the dresser 4 is changed, the controller 5 of the present embodiment does not change the dresser revolution "n'". In other words, the controller 5 of the present embodiment changes the table revolution "n" and maintains the dresser revolution "n'" constant, according to the position of the dresser 4 to the polishing table 1. An example in which the dresser revolution "n'" is also changed will be described in a second embodiment.

The controller 5 of the present embodiment may control the table revolution "n" such that a change in the relative linear speed "S" becomes sufficiently small even if the relative linear speed "S" is not maintained constant. The reason is that if the change in the relative linear speed "S" is sufficiently small, the in-plane variation of the surface roughness of the polishing pad 2 can be sufficiently reduced, as similar to the case where the relative linear speed "S" is maintained constant. For example, if a difference between the maximum value and the minimum value of the relative linear speed "S" is sufficiently small, the in-plane variation of the surface roughness of the polishing pad 2 can be sufficiently small.

Figure 3:
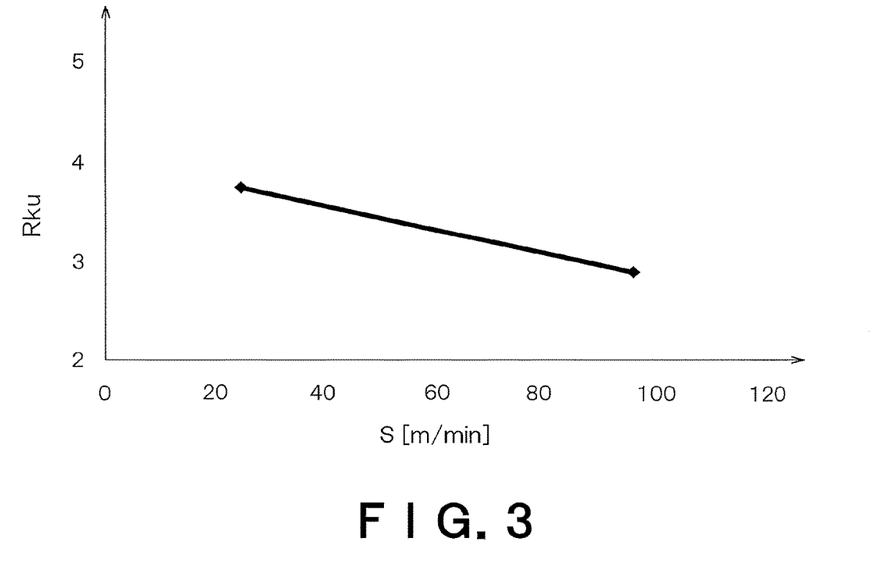
FIG. 3 is a graph indicating a relation between a relative linear speed and a surface roughness of the first embodiment.

FIG. 3 is a graph indicating a relation between the relative linear speed and the surface roughness of the first embodiment.

A horizontal axis in FIG. 3 indicates the relative linear speed "S". A vertical axis in FIG. 3 indicates a kurtosis Rku of a surface roughness curve of the polishing pad 2. The kurtosis Rku is an indicator indicating the surface roughness of the polishing pad 2.

As illustrated in FIG. 3, the kurtosis Rku becomes larger when the relative linear speed "S" is decreased, and the kurtosis Rku becomes smaller when the relative linear speed "S" is increased. Therefore, if a change in the relative linear speed "S" is increased, a change in the kurtosis Rku becomes larger, and the in-plane variation of the surface roughness of the polishing pad 2 becomes larger.

Consequently, the controller 5 of the present embodiment controls the table revolution "n" such that the relative linear speed "S" is maintained constant even if the position of the dresser 4 to the polishing table 1 is changed. Therefore, the present embodiment makes it possible, by suppressing the change in the kurtosis Rku, to reduce the in-plane variation of the surface roughness of the polishing pad 2.

Figure 4:
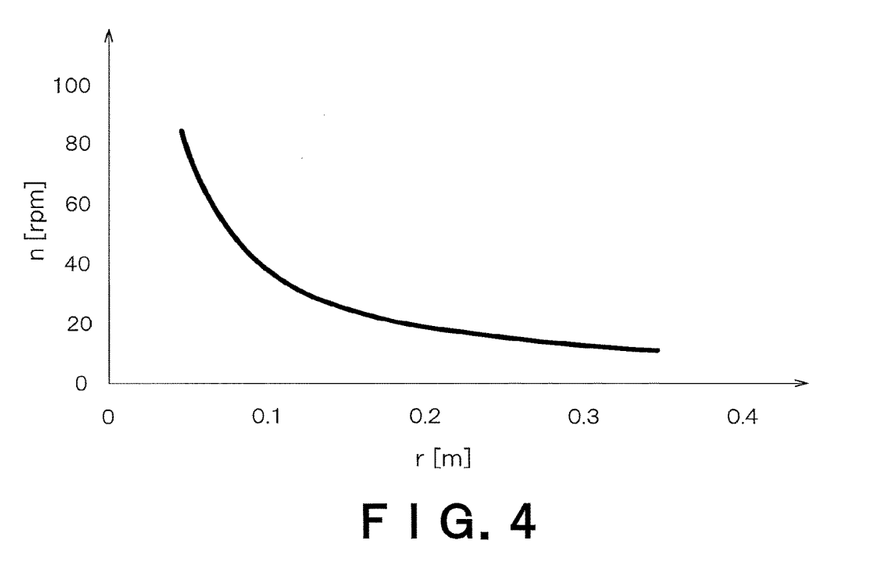
FIG. 4 is a graph indicating a relation between a dresser position and a table revolution of the first embodiment.

FIG. 4 is a graph indicating a relation between the dresser position and the table revolution of the first embodiment.

A horizontal axis of the FIG. 4 indicates the distance "r" between the center position of the polishing table 1 and the center position of the dresser 4. A vertical axis in the FIG. 4 indicates the table revolution "n". The table revolution "n" in FIG. 4 changes inversely proportional to the distance "r".

In FIG. 4, the whole surface of the polishing pad 2 is dressed when the dresser 4 passes through a region in which the distance "r" is 0.045 to 0.345 m. FIG. 4 indicates the table revolution "n" when the relative linear speed "S" is maintained at 24 m/min. In this case, the table revolution "n" is set to 84.9 rpm when the distance "r" is 0.045 m, and the table revolution "n" is set to 11.1 rpm when the distance "r" is 0.345 m.

As described above, the controller 5 of the present embodiment controls the table revolution "n" based on the position of the dresser 4 to the polishing table 1, while the polishing pad 2 is dressed. Therefore, the present embodiment makes it possible to reduce the in-plane variation of the surface roughness of the polishing pad 2. As a result, when a wafer is polished with the polishing pad 2, it is possible to suppress the in-plane variation of the polishing rate of the wafer, and to reduce a change in polishing temperature of the wafer so as to suppress the corrosion.

Second Embodiment

Figure 5:
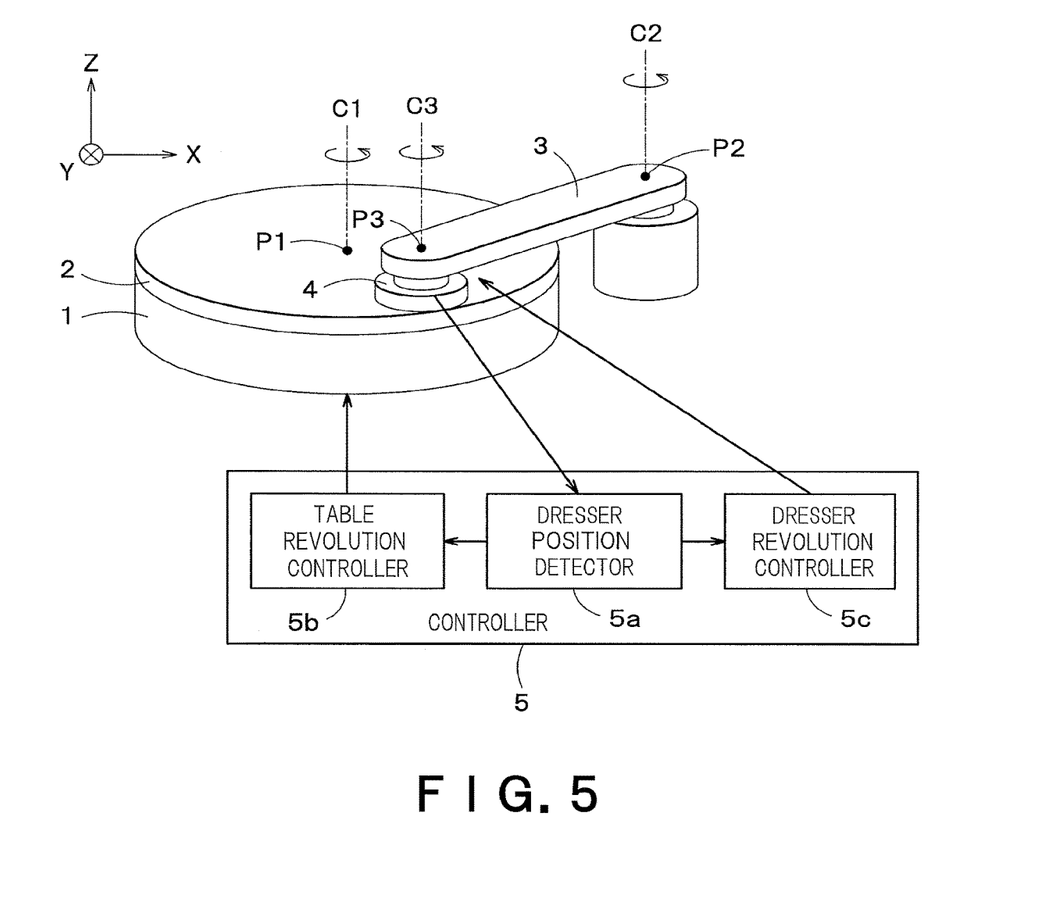
FIG. 5 is a perspective view illustrating a structure of a semiconductor manufacturing apparatus of a second embodiment.

FIG. 5 is a perspective view illustrating a structure of a semiconductor manufacturing apparatus of a second embodiment.

A controller 5 of the present embodiment includes a dresser revolution controller 5c, in addition to the dresser position detector 5a and the table revolution controller 5b.

The table revolution controller 5b and the dresser revolution controller 5c obtain the detection result of the center position of the dresser 4 from the dresser position detector 5a. Furthermore, the table revolution controller 5b controls the table revolution "n" based on the center position of the dresser 4, while the polishing pad 2 is dressed. On the other hand, the dresser revolution controller 5c controls the dresser revolution "n'" based on the center position of the dresser 4, while the polishing pad 2 is dressed.

In the present embodiment, the operation of the table revolution controller 5b is as same as the operation in the first embodiment. That is, the table revolution controller 5b controls the table revolution "n" such that the relative linear speed "S" is maintained constant even if the distance "r" is changed. Specifically, the table revolution controller 5b changes the table revolution "n" so as to be inversely proportional to the distance "r".

On the other hand, the dresser revolution controller 5c, for example, may control the dresser revolution "n'" such that the dresser revolution "n'" coincides with the table revolution "n" (n'=n). In this case, the dresser revolution "n'" changes inversely proportional to the distance "r", as similar to the table revolution "n". Such a control has the advantage that a linear speed of each portion of the dresser 4 with respect to the polishing table 1 becomes equal to the linear speed at the center position of the dresser 4 (i.e., the relative linear speed "S"). This makes it possible to further reduce the in-plane variation of the surface roughness of the polishing pad 2.

However, if the dresser revolution "n'" coincides with the table revolution "n", the dresser 4 rotates once when the polishing pad 2 rotates once. Consequently, a specific portion of the dresser 4 repeatedly passes through a specific portion of the polishing pad 2. Therefore, if the specific portion of the dresser 4 has a failure such as shortage of diamond, the specific portion of the polishing pad 2 may have a problem.

Consequently, the dresser revolution controller 5c, for example, may control the dresser revolution "n'" such that the dresser revolution "n'" does not coincide with the table revolution "n" (n'≠n). In this case, if a difference between the dresser revolution "n'" and the table revolution "n" is small, the linear speed of each portion of the dresser 4 with respect to the polishing table 1 becomes almost equal to the linear speed at the center position of the dresser 4 (i.e., the relative linear speed "S"). This makes it possible to effectively reduce the in-plane variation of the surface roughness of the polishing pad 2, as similar to the case where the dresser revolution "n'" coincides with the table revolution "n".

Therefore, the dresser revolution controller 5c of the present embodiment preferably controls the dresser revolution "n'" such that the dresser revolution "n'" becomes close to the table revolution "n" (n'≈n). For example, the dresser revolution controller 5c of the present embodiment controls the dresser revolution "n'" such that the dresser revolution "n'" becomes 75 to 125% of the table revolution "n" (0.75n≤n'≤1.25n).

In this case, a ratio n'/n between "n" and "n'" may be constant, or may be changed within a range of 0.75 to 1.25. In the former case, the ratio n'/n is preferably a value other than 1. In the latter case, the ratio n'/n is preferably always a value other than 1, but may be momentarily changed to 1.

Figure 6:
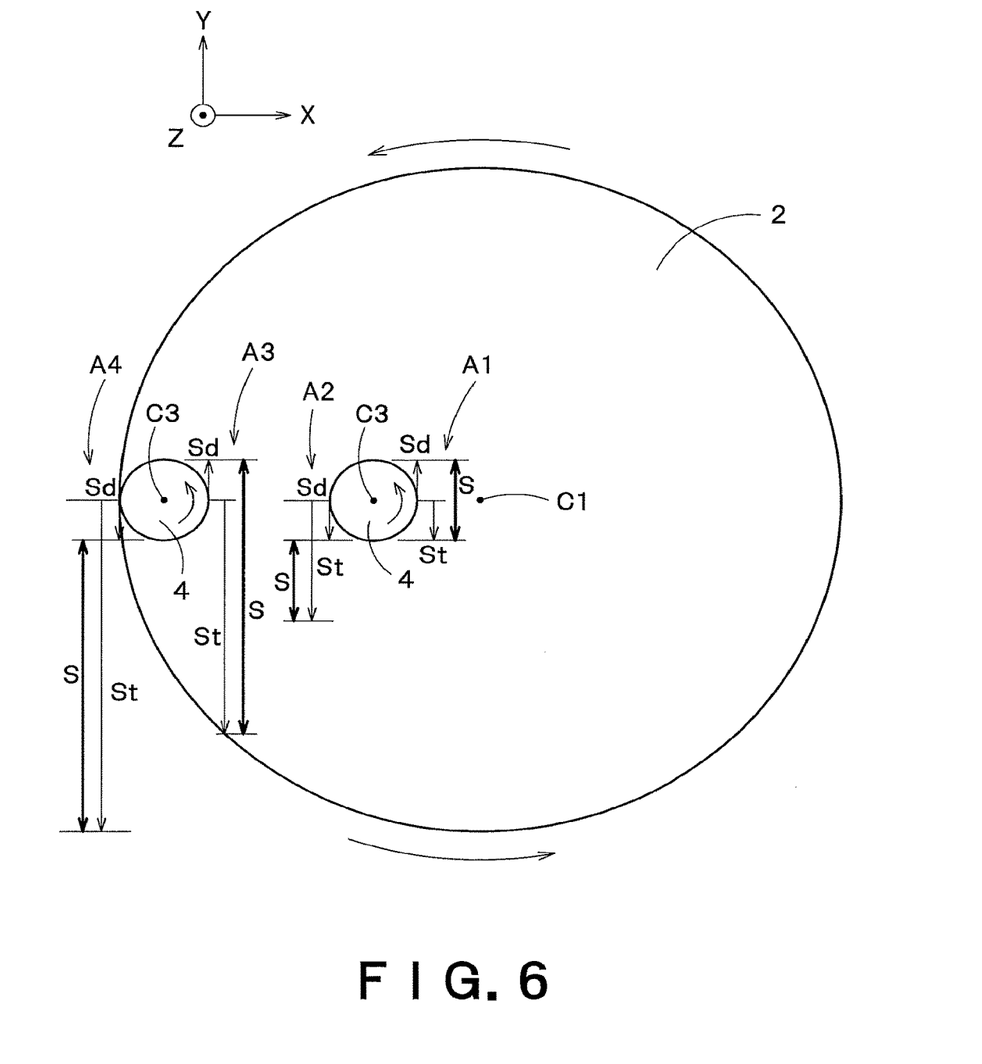
FIG. 6 is a top view for describing operations of the semiconductor manufacturing apparatus of the second embodiment.

FIG. 6 is a top view for describing operations of the semiconductor manufacturing apparatus of the second embodiment.

An arrow A1 indicates a table speed "St" and a dresser speed "Sd" at an inner portion of the dresser 4 when the dresser 4 is positioned at the center of the polishing table 1. An arrow A2 indicates the table speed "St" and the dresser speed "Sd" at an outer portion of the dresser 4 when the dresser 4 is positioned at the center of the polishing table 1. In the dresser 4 indicated by the arrows A1 and A2, the dresser revolution "n'" is equal to the table revolution "n". Therefore, the linear speed in the inner portion of the dresser 4 and the linear speed in the periphery of the dresser 4 are equal to the linear speed at the center position of the dresser 4 (the relative linear speed "S").

This is similar in the dresser 4 indicated by arrows A3 and A4. This dresser 4 is positioned at the periphery of the polishing table 1. Also in this dresser 4, the dresser revolution "n'" is equal to the table revolution "n". Therefore, the linear speed in the inner portion of the dresser 4 and the linear speed in the periphery of the dresser 4 are equal to the linear speed at the center position of the dresser 4 (the relative linear speed "S").

As described above, the controller 5 of the present embodiment controls the table revolution "n" and the dresser revolution "n'" based on the position of the dresser 4 to the polishing table 1, while the polishing pad 2 is dressed. Therefore, the present embodiment makes it possible to further reduce the in-plane variation of the surface roughness of the polishing pad 2.

Third Embodiment

Figure 7:
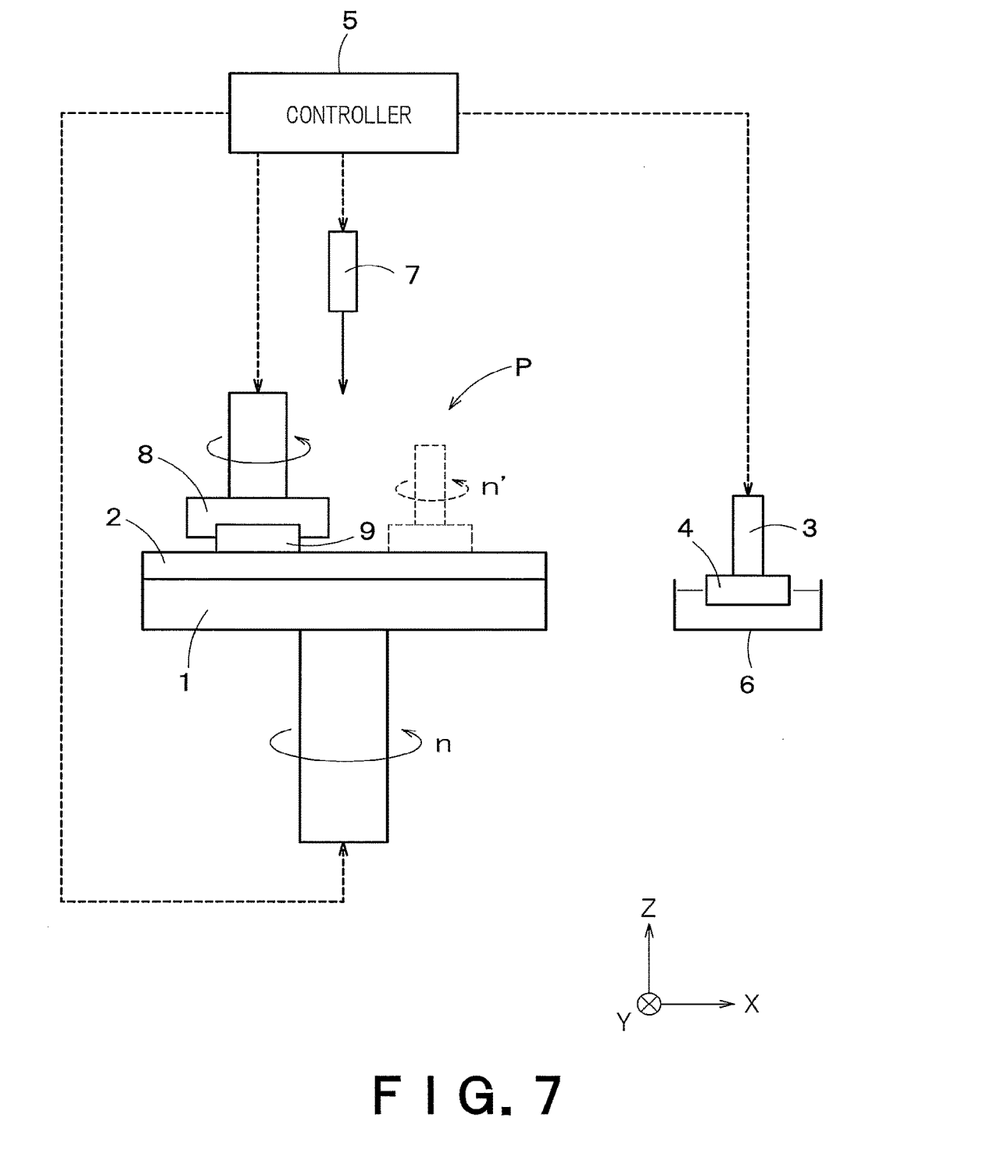
FIG. 7 is a cross sectional view illustrating a structure of a semiconductor manufacturing apparatus of a third embodiment.

FIG. 7 is a cross sectional view illustrating a structure of a semiconductor manufacturing apparatus of a third embodiment.

A semiconductor manufacturing apparatus of the present embodiment (FIG. 7) includes a waiting module 6, a slurry feeder 7 and a polishing head 8, in addition to components indicated in FIGS. 1 and 5. FIG. 7 further indicates a wafer 9 that is held downward by the polishing head 8.

FIGS. 1 and 5 indicate the dresser 4 that is dressing the polishing pad 2. On the other hand, FIG. 7 indicates the dresser 4 that is waiting as being soaked in water in the waiting module 6. When this dresser 4 is used for dressing, the dresser 4 is moved to a position indicated by an arrow P, and the polishing table 1 and the dresser 4 are rotated at the numbers of revolution "n" and "n'" respectively.

When the wafer 9 is to be polished, the semiconductor manufacturing apparatus of the present embodiment rotates the wafer 9 by the polishing head 8, rotates the polishing pad 2 by the polishing table 1, and brings the wafer 9 into contact with the polishing pad 2 to press the wafer 9 onto the polishing pad 2 with a constant load. In this manner, a surface of the wafer 9 is polished with the polishing pad 2. The slurry feeder 7 feeds slurry on the surface of the polishing pad 2 before or while the wafer 9 is polished.

Operations of the polishing table 1, the dressing module 3, the slurry feeder 7 and the polishing head 8 are controlled by a controller 5.

Figure 8A:
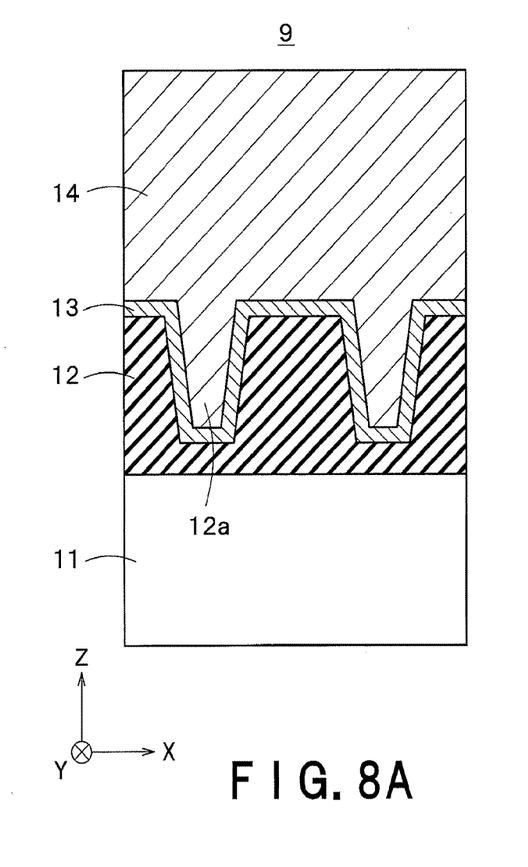
FIGS. 8A and 8B are cross sectional views illustrating a method of manufacturing a semiconductor device of the third embodiment.
Figure 8B:
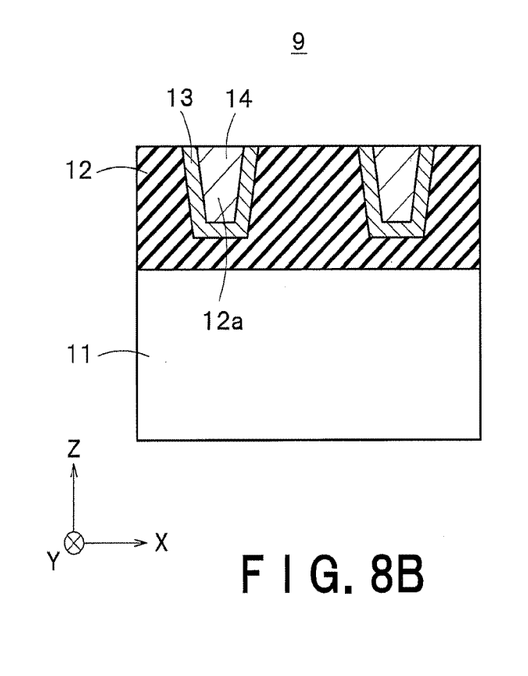

FIGS. 8A and 8B are cross sectional views illustrating a method of manufacturing a semiconductor device of the third embodiment.

FIG. 8A indicates a cross section of the wafer 9 before being polished by the semiconductor manufacturing apparatus of the present embodiment. This wafer 9 is prepared by the following steps.

First, an inter layer dielectric 12 is formed on a semiconductor substrate 11 (FIG. 8A). An example of the semiconductor substrate 11 is a silicon substrate. An example of the inter layer dielectric 12 is a silicon oxide film. The inter layer dielectric 12 may be directly formed on the semiconductor substrate 11, or may be formed on the semiconductor substrate 11 via another layer.

Next, inerconnect trenches 12a are formed in the inter layer dielectric 12 (FIG. 8A). The depth of the inerconnect trenches 12a are, for example, 80 nm. Next, a barrier metal layer 13 and an inerconnect material layer 14 are sequentially formed on the inter layer dielectric 12 (FIG. 8A). As a result, the barrier metal layer 13 is formed on a side face and a bottom face of the inerconnect trenches 12a, and the inerconnect material layer 14 is formed in the inerconnect trenches 12a via the barrier metal layer 13. The barrier metal layer 13 is, for example, a titanium (Ti) layer having a thickness of 10 nm. The inerconnect material layer 14 is, for example, a copper (Cu) layer having a thickness of 500 nm.

Next, a surface of the inerconnect material layer 14 is polished by the semiconductor manufacturing apparatus of the present embodiment (FIG. 8B). This polishing process is continued until a surface of the inter layer dielectric 12 is exposed. As a result, the barrier metal layer 13 and the inerconnect material layer 14 out of the inerconnect trenches 12a are removed, and damascene inerconnects are formed in the inerconnect trenches 12a.

This polishing process is performed as described below in the semiconductor manufacturing apparatus illustrated in FIG. 7.

First, a dummy wafer mounted to the polishing head 8 is polished for 30 seconds while feeding slurry on a surface of the polishing pad 2, and then the polishing head 8 is moved to a load port. Next, the surface of the polishing pad 2 is dressed with the dresser 4. At this time, the dressing module 3 sweeps the surface of the polishing pad 2 with the dresser 4 such that the distance "r" is changed within a range of 0.045 to 0.345 m. In this sweeping, the dresser 4 reciprocates three times at a speed of ten seconds per reciprocation.

At this time, the dresser position detector 5a detects the distance "r" between the center position of the polishing table 1 and the center position of the dresser 4. The table revolution controller 5b controls the table revolution "n" such that the relative linear speed "S" is maintained at 24 m/min while the polishing pad 2 is dressed. Furthermore, the dresser revolution controller 5c may control the dresser revolution "n'" such that the dresser revolution "n'" becomes smaller than the table revolution "n" by 1 rpm while the polishing pad 2 is dressed (n'=n−1 rpm). After the dressing is finished, the dresser 4 is moved to the waiting module 6.

Next, the polishing head 8 holding the wafer 9 is moved on the polishing pad 2, and the wafer 9 is polished while slurry is fed on the surface of the polishing pad 2. This polishing process is continued until the surface of the inter layer dielectric 12 is exposed. As a result, the barrier metal layer 13 and the inerconnect material layer 14 out of the inerconnect trenches 12a are removed, and the damascene inerconnects are formed in the inerconnect trenches 12a.

In a case where plural wafers 9 are to be processed, dressing of the polishing pad 2 and polishing of each wafer 9 are alternately performed. In this way, plural semiconductor devices are manufactured from the plural wafers 9.

As described above, the controller 5 of the present embodiment controls the table revolution "n" based on the position of the dresser 4 to the polishing table 1, while the polishing pad 2 is dressed. Therefore, the present embodiment makes it possible to reduce the in-plane variation of the surface roughness of the polishing pad 2. As a result, when a wafer 9 is polished with the polishing pad 2, it is possible to suppress the in-plane variation of the polishing rate of the wafer 9, and to reduce a change in polishing temperature of the wafer 9 so as to suppress the corrosion.

For example, if the in-plane variation of the polishing rate of the wafer 9 occurs, a portion of the inerconnect material layer 14 may be left outside the inerconnect trenches 12a. Also, if the polishing temperature of the wafer 9 fluctuates, this may cause a corrosion in which a portion of the inerconnect material layer 14 is corroded and dissolved. According to the present embodiment, it is possible, by suppressing such phenomenon, to prevent defective interconnects such as the short-circuiting between interconnects and the opening of interconnects.

While certain embodiments have been described, these embodiments have been presented by way of example only, and are not intended to limit the scope of the inventions. Indeed, the novel apparatuses and methods described herein may be embodied in a variety of other forms; furthermore, various omissions, substitutions and changes in the form of the apparatuses and methods and described herein may be made without departing from the spirit of the inventions. The accompanying claims and their equivalents are intended to cover such forms or modifications as would fall within the scope and spirit of the inventions.

The invention claimed is:

1. A semiconductor manufacturing apparatus comprising:
a polishing table configured to hold a polishing pad for polishing a substrate, and to rotate the polishing pad;
a dressing module configured to hold a dresser for dressing the polishing pad, and to dress a surface of the polishing pad by sweeping the polishing pad with the dresser while rotating the dresser; and
a controller configured to control a number of revolutions of the polishing table based on a position of the dresser to the polishing table, while the polishing pad is dressed,
wherein the controller controls the number of revolutions of the polishing table such that a relative linear speed between the polishing table and the dresser on a rotational axis of the dresser is maintained constant even if the position of the dresser to the polishing table is changed.

2. A semiconductor manufacturing apparatus comprising:
a polishing table configured to hold a polishing pad for polishing a substrate, and to rotate the polishing pad;
a dressing module configured to hold a dresser for dressing the polishing pad, and to dress a surface of the polishing pad by sweeping the polishing pad with the dresser while rotating the dresser; and
a controller configured to control a number of revolutions of the polishing table based on a position of the dresser to the polishing table, while the polishing pad is dressed,
wherein the controller changes the number of revolutions of the polishing table and maintains a number of revolutions of the dresser constant, according to the position of the dresser to the polishing table.

3. A semiconductor manufacturing apparatus comprising:
a polishing table configured to hold a polishing pad for polishing a substrate, and to rotate the polishing pad;
a dressing module configured to hold a dresser for dressing the polishing pad, and to dress a surface of the polishing pad by sweeping the polishing pad with the dresser while rotating the dresser; and
a controller configured to control a number of revolutions of the polishing table based on a position of the dresser to the polishing table, while the polishing pad is dressed,
wherein the controller controls, based on the position of the dresser to the polishing table, the number of revolutions of the polishing table and a number of revolutions of the dresser such that the number of revolutions of the dresser becomes 75 to 125% of the number of revolutions of the polishing table.

4. The apparatus of claim 3, wherein the controller detects a distance between a rotational axis of the polishing table and a rotational axis of the dresser, and controls the number of revolutions of the polishing table and the number of revolutions of the dresser based on the distance between the rotational axes.

5. The apparatus of claim 4, wherein the controller reduces the number of revolutions of the polishing table with an increase of the distance between the rotational axes.

6. A method of manufacturing a semiconductor device, comprising:
holding a polishing pad for polishing a substrate by a polishing table, and rotating the polishing pad;
holding a dresser for dressing the polishing pad by a dressing module, and dressing a surface of the polishing pad by sweeping the polishing pad with the dresser while rotating the dresser; and
controlling a number of revolutions of the polishing table by a controller based on a position of the dresser to the polishing table, while the polishing pad is dressed,
wherein the controller controls the number of revolutions of the polishing table such that a relative linear speed between the polishing table and the dresser on a rotational axis of the dresser is maintained constant even if the position of the dresser to the polishing table is changed.

7. A method of manufacturing a semiconductor device, comprising:
holding a polishing pad for polishing a substrate by a polishing table, and rotating the polishing pad;
holding a dresser for dressing the polishing pad by a dressing module, and dressing a surface of the polishing pad by sweeping the polishing pad with the dresser while rotating the dresser; and
controlling a number of revolutions of the polishing table by a controller based on a position of the dresser to the polishing table, while the polishing pad is dressed,
wherein the controller changes the number of revolutions of the polishing table and maintains a number of revolutions of the dresser constant, according to the position of the dresser to the polishing table.

8. A method of manufacturing a semiconductor device, comprising:
holding a polishing pad for polishing a substrate by a polishing table, and rotating the polishing pad;

holding a dresser for dressing the polishing pad by a dressing module, and dressing a surface of the polishing pad by sweeping the polishing pad with the dresser while rotating the dresser; and controlling a number of revolutions of the polishing table by a controller based on a position of the dresser to the polishing table, while the polishing pad is dressed, wherein the controller controls, based on the position of the dresser to the polishing table the number of revolutions of the polishing table and a number of revolutions of the dresser such that the number of revolutions of the dresser becomes 75 to 125% of the number of revolutions of the polishing table.

9. The method of claim 8, wherein the controller detects a distance between a rotational axis of the polishing table and a rotational axis of the dresser, and controls the number of revolutions of the polishing table and the number of revolutions of the dresser based on the distance between the rotational axes.

10. The method of claim 9, wherein the controller reduces the number of revolutions of the polishing table with an increase of the distance between the rotational axes.

* * * * *